United States Patent
Matsumoto et al.

(10) Patent No.: US 7,455,564 B2
(45) Date of Patent: Nov. 25, 2008

(54) DISPLAY DEVICE AND METHOD FOR MANUFACTURING THE SAME

(75) Inventors: Toshiki Matsumoto, Kanagawa (JP); Hirokazu Yamada, Kanagawa (JP)

(73) Assignee: Sony Corporation, Tokyo (JP)

( * ) Notice: Subject to any disclaimer, the term of this patent is extended or adjusted under 35 U.S.C. 154(b) by 489 days.

(21) Appl. No.: 11/287,067

(22) Filed: Nov. 25, 2005

(65) Prior Publication Data
US 2006/0113899 A1    Jun. 1, 2006

(30) Foreign Application Priority Data
Dec. 1, 2004    (JP) .......................... P2004-348068

(51) Int. Cl.
*H01J 1/62* (2006.01)
*H01J 63/04* (2006.01)
(52) U.S. Cl. ....................................... 445/24
(58) Field of Classification Search ................ 445/24; 313/503–506; 428/690, 917
See application file for complete search history.

(56) References Cited
U.S. PATENT DOCUMENTS

| | | | |
|---|---|---|---|
| 6,198,217 B1 * | 3/2001 | Suzuki et al. | 313/504 |
| 2003/0132704 A1 * | 7/2003 | Aziz et al. | 313/506 |
| 2003/0189401 A1 * | 10/2003 | Kido et al. | 313/504 |
| 2004/0085015 A1 * | 5/2004 | Kim | 313/504 |
| 2005/0074629 A1 * | 4/2005 | Forrest et al. | 428/690 |
| 2006/0063027 A1 * | 3/2006 | Vestweber et al. | 428/690 |
| 2007/0122653 A1 * | 5/2007 | Breuning et al. | 428/690 |

* cited by examiner

*Primary Examiner*—Joseph L. Williams
*Assistant Examiner*—Bumsuk Won
(74) *Attorney, Agent, or Firm*—Sonnenschein Nath & Rosenthal LLP

(57) ABSTRACT

A method for manufacturing a display device with an organic light-emitting element includes the steps of providing a first electrode on a substrate, providing on the first electrode a mixture layer having two or more organic materials differing in glass transition point, heating the mixture layer at a temperature higher and lower than respectively the lowest and highest of the glass transition points of the organic materials, providing a light-emitting layer on the mixture layer, thereby providing a organic layer having at least the mixture layer and the light-emitting layer, and finally providing a second electrode on the organic layer.

8 Claims, 4 Drawing Sheets

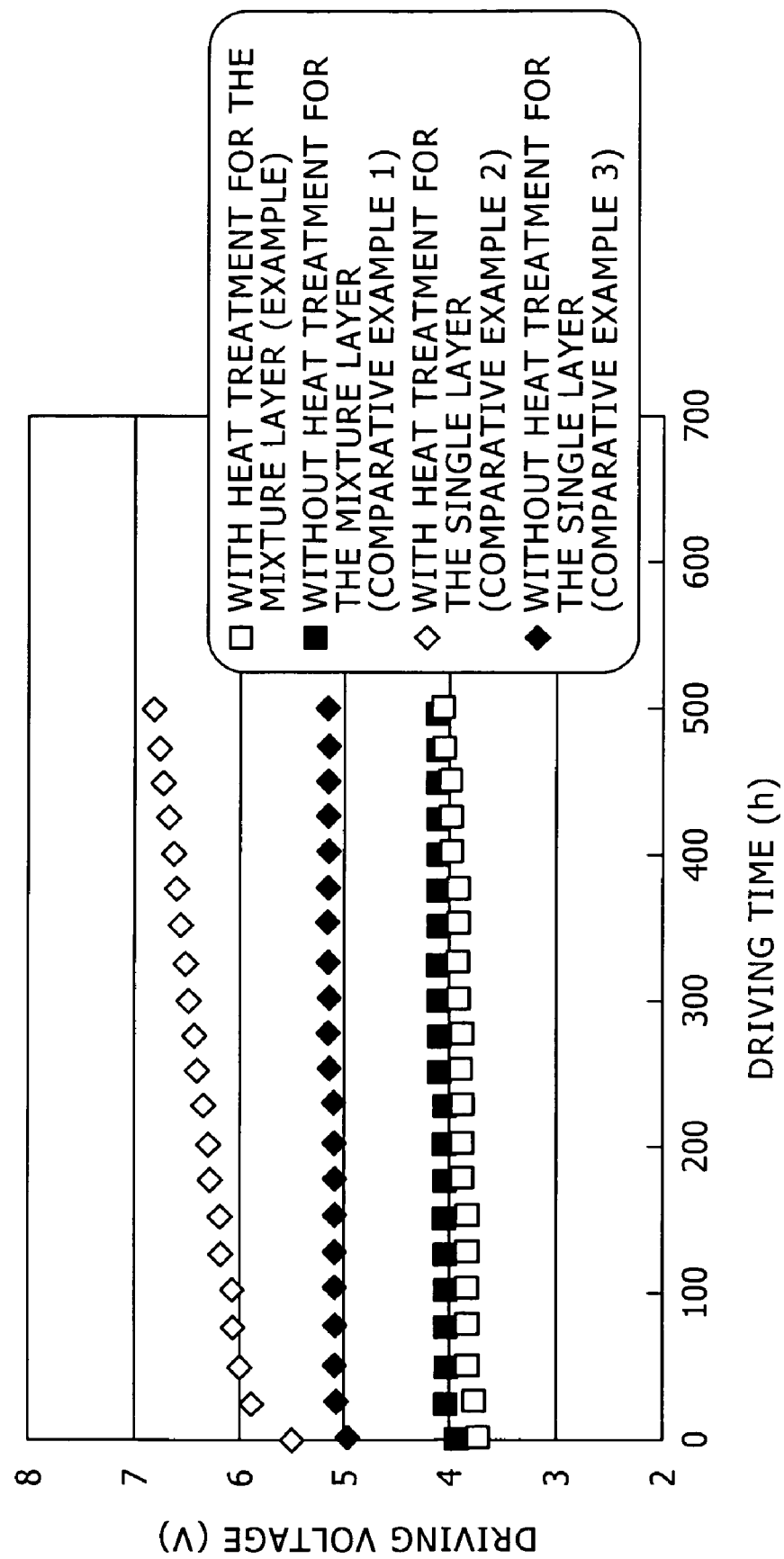

DISPLAY DEVICE AND METHOD FOR MANUFACTURING THE SAME

CROSS REFERENCES TO RELATED APPLICATIONS

The present invention contains subject matter related to Japanese Patent Application No. 2004-348068 filed in the Japanese Patent Office on Dec. 1, 2004, the entire contents of which being incorporated herein by reference.

BACKGROUND OF THE INVENTION

1. Field of the Invention

The present invention relates to a display device and a method for manufacturing thereof. The display device is of the type having a first electrode, more than one organic layer including an emitting layer, and a second electrode, which are sequentially arranged on a substrate, so that the light generated by the emitting layer radiates through the first or second electrode.

2. Description of the Related Art

Among recent flat panel display devices attracting attention is an organic light-emitting display device that employs an organic luminous element. Being selfluminous, it has a wide viewing area, a low power consumption, and a capability of responding to high-speed video signals for high-definition television.

The organic luminous element mentioned above has a first electrode, more than one organic layer including an emitting layer, and a second electrode, which are sequentially arranged on a substrate. In the case where it is used for a display device of active matrix type, the first electrode is formed on a planarized insulating film that covers TFTs (Thin Film Transistors) on the substrate.

In the meantime, the organic light-emitting display device with the organic luminous elements mentioned above is required to be free of dark spots (pixels emitting no light) which are greatly detrimental to the display quality and manufacturing yield. Dark spots are caused by foreign matter adhering to the first electrode during production. Foreign matter adhering to the first electrode entraps air thereunder when an organic layer is formed thereon. The entrapped air causes dark spots when the finished organic luminous element undergoes degassing. Unfortunately, it is difficult to completely protect the first electrode from foreign matter before it is covered with the organic layer.

Thus, there has been proposed a method for reducing the occurrence of dark spots. This method has the steps of providing a transparent electrode (a first electrode) on a substrate and providing a hole transporting layer, with a hole injection layer interposed between them, and finally heating the substrate at a temperature above the glass transition point and below the melting point of the hole transporting layer, thereby melting the hole transporting layer to cover foreign matter. (See Japanese Patent Laid-open Publication No. 2000-91067.)

There has been proposed another method for reducing dark spots. This method has the steps of providing a first electrode on a substrate, providing a hole transporting layer thereon, and finally heating the substrate at a temperature equal to the glass transition point of the hole transporting layer, thereby improving the properties of the hole transporting layer. (See Japanese Patent No. 3473258.)

According to the above-mentioned patent documents, the organic light-emitting display device is produced by the method which is explained below with reference FIG. 5A.

The illustrated organic light-emitting display device has the organic light-emitting element comprising a first electrode 14, an organic layer 18 including an emitting layer 18c, and a second electrode 19, which are sequentially arranged on a substrate 11.

As shown in FIG. 5B, which is an enlarged view of the region A in FIG. 5A, the hole injection layer 18a will not completely cover the first electrode 14 if there exists a particle of foreign matter B adhering thereto. A gap C will remain under the foreign matter B.

The hole injection layer 18a is heated at a temperature equal to or higher than its glass transition point (Tg). The result of heating is shown in FIG. 5C. That is, the hole injection layer 18a flows to cover the foreign matter B, thereby eliminating the gap C thereunder (shown in FIG. 5B).

OBJECT AND SUMMARY OF THE INVENTION

However, according to the above-mentioned manufacturing method, the hole injection layer 18a deteriorates by heat treatment at a temperature equal to or higher than its glass transition point. This results in a poor surface state between the hole injection layer 18a and the hole transporting layer 18b. The poor surface state reduces the efficiency of hole injection from the hole injection layer 18a into the hole transporting layer 18b. This in turn decreases the luminance of the organic light-emitting element owing to unbalanced hole injection. Moreover, the deteriorated hole injection layer 18a raises resistance between the auxiliary electrode 15 and the second electrode 19. This in turn raises the initial driving voltage and also raises the continuous driving voltage with a lapse of time. Eventually this leads to an increased power consumption of the display device.

An embodiment of the present invention is directed to a method for manufacturing a display device with an organic light-emitting element comprising a first electrode, an organic layer including a light-emitting layer, and a second electrode which are sequentially arranged on a substrate, the method having the steps of providing a first electrode on a substrate, providing on the first electrode a mixture layer comprising two or more organic materials differing in glass transition point, heating the mixture layer at a temperature higher and lower than respectively the lowest and highest of the glass transition points of the organic materials, providing a light-emitting layer on the mixture layer, thereby providing a organic layer having at least the mixture layer and the light-emitting layer, and finally providing a second electrode on the organic layer.

An embodiment of the present invention is also directed to a display device comprising a plurality of organic light-emitting elements, each having a first electrode, an organic layer including a light-emitting layer, and a second electrode, which are sequentially arranged on a substrate. And a mixture layer comprising two or more organic materials differing in glass transition point is provided between the first electrode and the light-emitting layer.

BRIEF DESCRIPTION OF THE DRAWINGS

Embodiments of the present invention will be described in detail based on the following figures, wherein:

FIG. 4 is a graph showing the change with time of the initial driving voltage and the continuous driving voltage that occurs in the display devices pertaining to Example and Comparative Examples of an embodiment of the present invention;

DESCRIPTION OF THE PREFERRED EMBODIMENTS

The embodiments of the display device according to the present invention will be described in more detail with reference to the accompanying drawings.

The First Embodiment

The first embodiment will be illustrated with an organic light-emitting display device of top emission type designed for active matrix driving, whose structure and manufacturing steps will be described below. The organic light-emitting display device has organic EL elements, each consisting of a first electrode, an organic layer including a light-emitting layer, and a second electrode which are sequentially arranged on a substrate. Incidentally, symbols used below are consistent with those in the section of prior art.

Figure 1A:
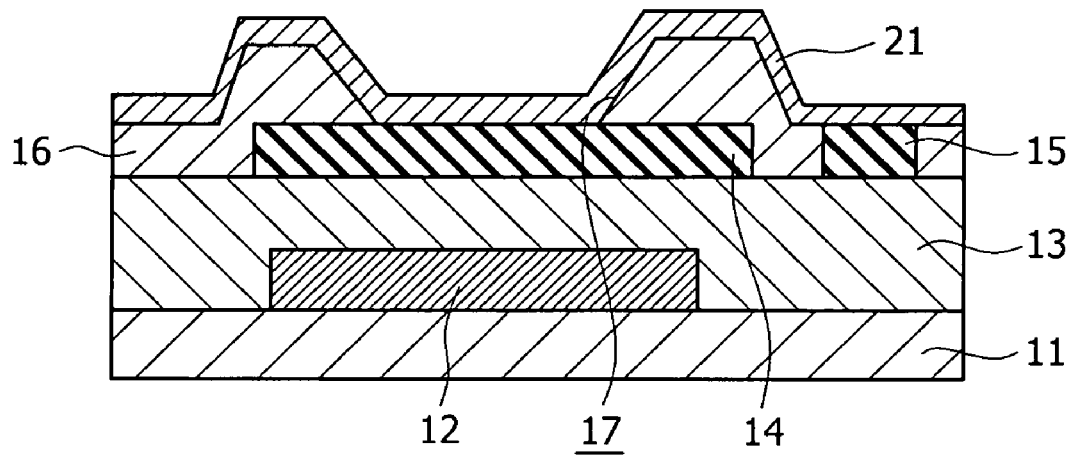
FIG. 1A is a sectional view showing the first embodiment of the method for manufacturing a display device according to an embodiment of the present invention.

In the first step shown in FIG. 1A, TFTs 12 are formed on the substrate 11 (of silicon or the like) such that they correspond to the organic light-emitting elements to be formed in the subsequent steps. The substrate may be formed from a transparent insulating material such as glass, plastics, and quartz. The substrate 11 (on which the TFTs 12 have been formed) is coated by spin coating with a planarized insulating film 13 of polyimide or the like.

The planarized insulating film 13 undergoes exposure and development, so that contact holes (not shown) for connection with the TFTs 12 are formed therein. On the planarized insulating film 13 is formed a conductive film (not shown) which fills the contact holes. The conductive film is composed of a reflective film of metal, such as chromium (Cr), aluminum (Al), and silver (Ag), and an ITO film, which are formed sequentially one over another by vapor deposition or sputtering.

The conductive film is patterned to form the first electrode (anode) 14 and the auxiliary electrode 15 on the planarized insulating film 13. The first electrode 14 connects to the TFT 12 through the contact hole and corresponds to each organic light-emitting element. The auxiliary electrode 15 is arranged in a lattice pattern between adjacent ones of the first electrode 14 and is insulated from them. The first electrode 14 functions as the lower electrode, so that emitted light radiates from the upper electrode to be formed in the later steps.

The planarized insulating film 13, on which the first electrode 14 and the auxiliary electrode 15 have been formed, is covered with an isolation dielectric film 16 of silicon oxide ($SiO_2$) or the like by CVD method. The isolation dielectric film 16 undergoes patterning by lithography or the like, so that a pixel opening 17, in which an organic light-emitting element is formed later, is formed and the surfaces of the first electrode 14 and the auxiliary electrode 15 are exposed. The substrate 11 undergoes pretreatment with oxygen plasma.

The mixture layer 21 comprising two organic materials differing in Tg is formed on the isolation dielectric film 16 including the first electrode and the auxiliary electrode 15 in a high-vacuum environment, say, at $10^{-4}$ Pa. The mixture layer 21 is formed by codeposition of two organic materials. The mixture layer 21 functions as the hole injection layer to inject holes into the hole transporting layer 18b to be formed after the step for the first electrode 14.

Of the two organic materials constituting the mixture layer 21, the one having a lower Tg should have a Tg no lower than 50° C. and no higher than 150° C., preferably no lower than 90° C. and no higher than 150° C. The reason for this is that the mobile display for outdoor use is generally required to have heat resistance of about 90° C. Common organic materials capable of hole injection or hole transportation include amine-based ones, whose typical example is triphenyldiamine (TPD). Unfortunately, TPD is poor in thermal stability, with its Tg being 63° C. The organic material used in the present invention is α-naphthylphenyldiamine (α-NPD), which is naphthylated TPD in polymer form, with its Tg raised to 96° C. Other amine-based materials whose Tg is raised by polymerization of TPD include tris(1-naphthylamino)triphenylamine (1-TNATA) in starburst form, with a Tg of 113° C., and NTPA in tetramer form, with a Tg of 148° C., in which the terminal phenyl group is replaced by a naphthyl group. These materials with a lower Tg flows when the mixture layer 21 is heated in the subsequent step at a temperature higher than this Tg.

On the other hand, the organic material having a higher Tg should be the one which has a Tg no lower than 200° C. It includes, for example, non-amine-based materials, such as copper phthalocyanine (Cu-Pc), which is used in the present invention. Another example may be selected from the non-amine-based materials having the properties of p-type semiconductor which are reported in US-2004-0113547 and Japanese Translation of Unexamined PCT Application No. 2003-519432. These materials remain unchanged when the mixture layer 21 is heated later at a temperature lower than the higher Tg.

The two organic materials should have respectively a lower Tg of $Tg_1$ and a higher Tg of $Tg_2$ such that the difference between $Tg_1$ and $Tg_2$ is no smaller than 50° C. Such a temperature difference makes it easy to set up the heating temperature of the mixture layer 21.

It is desirable that the organic material with a low Tg and the organic material with a high Tg should be mixed in a ratio of from 10:90 to 90:10 by percentage. The organic material with a low Tg, which accounts for more than 10%, permits the mixture layer 21 to flow sufficiently. On the other hand, the organic material with a high Tg, which accounts for less than 90%, protects the mixture layer from thermal degradation. In this embodiment, in which α-NPD is used as the low-Tg organic material and Cu-Pc is used as the high-Tg organic material, the mixing ratio of α-NPD and Cu-Pc should be 50:50 in percentage for the best result.

The mixture layer 21 should be formed such that its thickness is in the range of 1 to 200 nm. With a thickness larger than 1 nm, the mixture layer 21 can sufficiently cover foreign matter adhering to the first electrode 14. With a thickness smaller than 200 nm, the mixture layer permits the pixel opening 17 to be formed in a uniform thickness.

The substrate 11 on which the mixture layer 21 has been formed undergoes heat treatment at a temperature higher than $Tg_1$ and lower than $Tg_2$. Heat treatment in this manner permits the low-Tg organic material to flow, so that the mixture layer 21 covers foreign matter adhering to the first electrode 14, thereby removing air under the foreign matter. Heating at a temperature lower than $Tg_2$ permits the high-Tg organic material in the mixture layer 21 to remain intact without thermal degradation. Hence, the mixture layer 21 remains intact. If the low-Tg organic material has a crystallization temperature Tc between $Tg_1$ and $Tg_2$, the heat treatment should be carried out at a temperature lower than Tc. In this embodiment, heat treatment for the mixture layer 21 should be carried out at a temperature higher than 96° C. and lower than 184° C., because α-NPD has the $Tg_1$ of 96° C. and the Tc of 184° C. and Cu-Pc has the $Tg_2$ higher than 200° C.

The heat treatment should be carried out in an atmosphere with an oxygen content lower than 50 ppm. The pressure of the atmosphere should be lower than $10^{-4}$ Pa at which the mixture layer 21 has been formed. Heating in an atmosphere with a high oxygen content causes oxidation to the surface of the mixture layer 21, thereby reducing the efficiency of hole injection from the mixture layer 21 into the hole transporting layer to be formed later on the mixture layer 21. This results in unbalanced hole injection, which in turn raises the driving voltage and deteriorates the luminance, with the organic light-emitting display device becoming poor in characteristic properties. The above-mentioned high-vacuum atmosphere is not essential; any atmosphere (say, nitrogen) may be acceptable so long as its oxygen content is lower than 50 ppm.

The duration of heat treatment for the mixture layer 21 varies depending on the heating temperature and the Tg of the hole transporting material constituting the mixture layer 21. It is usually about 2 to 30 minutes. Heating may be accomplished by bringing the substrate 11 into contact with a heater, such as hot plate, or by utilizing radiation heat. The heating method is not specifically restricted so long as it is capable of heating the substrate 11 uniformly and stably, with a temperature fluctuation within about 5° C.

According to the embodiment mentioned above, the mixture layer comprising two organic materials differing in Tg is formed and then it undergoes heat treatment. However, the embodiment may be modified such that the mixture layer 21 is formed from three or more organic materials differing in Tg. In this case, the heat treatment for the mixture layer 21 should be carried out at a temperature higher than the Tg of the organic material having the lowest Tg and lower than the Tg of the organic material having the highest Tg.

Figure 1B:
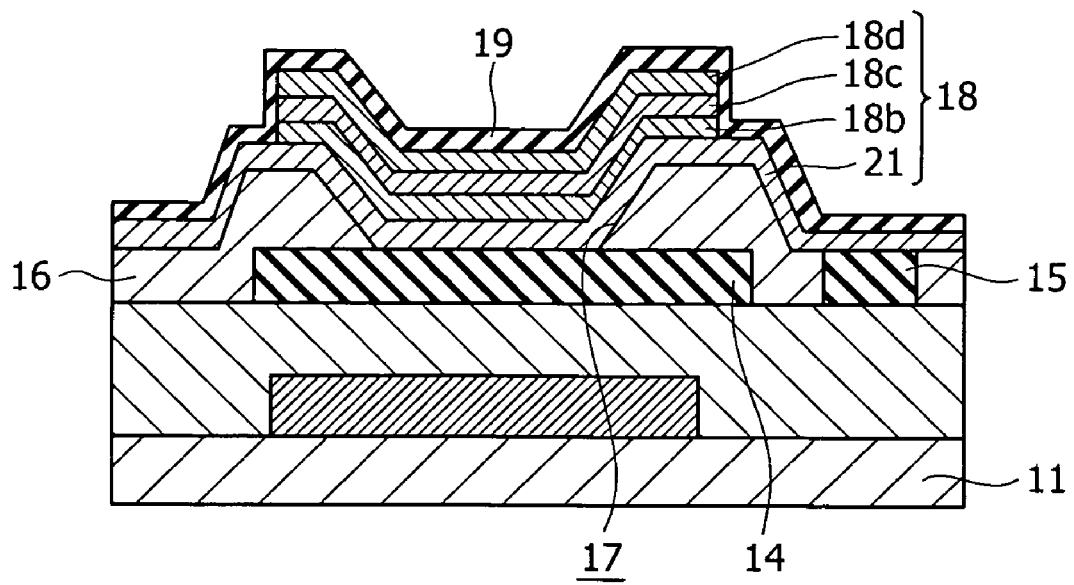
FIG. 1B is a sectional view showing the first embodiment of the method for manufacturing a display device according to an embodiment of the present invention.

The pixel opening 17 is coated by the hole transporting layer 18b, the light-emitting layer 18c, and the electron transporting layer 18d, which are formed continuously and sequentially by vacuum deposition, as shown in FIG. 1B. Thus the organic layer 18 including the mixture layer 21 is formed. This vacuum deposition is carried out in a high-vacuum atmosphere of $10^{-4}$ Pa by using the mask (not shown) which has been used to form the organic layer on the substrate 11. In the case where organic light-emitting elements for three RGB colors are to be formed, the vacuum deposition for the hole transporting layer 18b, the light-emitting layer 18c, and the electron transporting layer 18d should be repeated three times, with the deposition mask replaced for individual colors. In this way it is possible to form the organic layer 18 for each color having the mixture layer 21 and the above-mentioned layers.

In this embodiment, the hole transporting layer 18b on the mixture layer 21 is formed from Cu-Pc. Although the hole transporting layer 18b is formed on the mixture layer 21 in this embodiment, it may be formed directly on the mixture layer 21. Moreover, this embodiment in which the hole transporting layer 18b is formed for each color of the organic light-emitting element may be modified such that it is formed on the mixture layer 21 without using the deposition mask if it is formed from a single material for individual organic light-emitting elements. In this case, it is necessary to form the hole transporting layer 18b from an organic material which does not increase resistance between the auxiliary electrode 15 and the second electrode mentioned later.

The light-emitting layer 18c formed on the hole transporting layer 18b varies in construction for each emission color of the organic light-emitting element. For example, the light-emitting layer 18c of the organic light-emitting element for red light is formed from 8-quinolinol aluminum complex ($Alq_3$) incorporated with 2 vol % of 4-dicyanomethylene-6-(p-dimethylaminostyryl)-2-methyl-4H-pyran (DCM). It is about 40 nm thick. The light-emitting layer 18c of the organic light-emitting element for green light is formed from $Alq_3$. It is about 50 nm thick. The light-emitting layer 18c of the organic light-emitting element for blue light is formed from bathocuproine (BCP). It is about 15 nm thick.

The electron transporting layer 18d on the light-emitting layer 18c should be formed from $Alq_2$, with a thickness of 30 nm. The light-emitting layer 18c may also function as the electron transporting layer 18d depending on the color of light from the organic light-emitting element. Thus the electron transporting layer 18d should be formed only on the light-emitting layer 18c of the organic light-emitting element which needs improved characteristic properties.

The electron transporting layer 18d may optionally be coated with an electron injection layer (not shown). In this case, it is formed immediately after vacuum deposition for the layers 18b to 18d, with the high-vacuum atmosphere maintained. In some organic light-emitting elements, the electron transporting layer 18d functions as the electron injection layer; therefore, the electron injection layer should be formed only on the electron transporting layer 18d of the organic light-emitting layer which needs improved characteristic properties.

In this embodiment, each organic layer 18 is formed by deposition in a high-vacuum atmosphere; however, it may also be formed by ink jet printing method or ordinary printing method without specific restrictions.

After the organic layer 18 has been formed as mentioned above, an electron injection layer (not shown) about 1 nm thick is formed by vapor deposition from an inorganic material, such as lithium fluoride, in such a way that it covers the organic layer 18 and the mixture layer 21 outside the pixel opening 17. This step immediately follows the preceding step, with the high-vacuum atmosphere maintained. Also, this step is carried out by using a deposition mask (not shown) having openings corresponding to the pixel regions in which the organic light-emitting elements are formed.

The electron injection layer is coated with the second electrode (cathode) 19, about 10 nm thick, which is formed from a semitransparent MgAg alloy (composed of Mg and Ag in a ratio of 10:1) by vacuum deposition through a mask. The second electrode 19 functions as the top electrode. The second electrode 19 extends over the auxiliary electrode 15, so that the second electrode 19 is connected to the auxiliary electrode 15 through the electron injection layer and the mixture layer 21.

The above-mentioned steps are followed by ordinary steps used for the production of organic light-emitting display devices in related art. That is, the second electrode 19 is coated with a transparent electrode (not shown) of IZO, which is subsequently coated with a protective film of silicon nitride. The protective film and the periphery of the substrate 11 are coated with a thermosetting resin, on which is subsequently placed a top glass substrate. Resin sealing is accomplished by heating.

The above-mentioned steps give an organic light-emitting display device of top emission type, in which the light-emitting layer 18c in the organic layer 18 emits light which, after reflection by the first electrode 14 containing the Ag alloy film, radiates through the second electrode 19 formed from a semitransparent MgAg alloy.

The above-mentioned display device and the above-mentioned method for production of the display device offer the following advantage. The mixture layer 21, which, when heated at a temperature higher than $Tg_1$ to cause the low-Tg hole transporting material to flow, covers the foreign matter adhering to the first electrode 14, thereby eliminating air entrapped by the foreign matter. Thus the display device is free of dark spots resulting from entrapped air.

In addition, the mixture layer 21, which, when heated at a temperature lower than $Tg_2$ remains unchanged without causing thermal degradation to the high-Tg organic material. The mixture layer 21 remaining unchanged permits its efficient hole injection into the hole transporting layer 18b, while keeping the balanced hole injection.

The fact that the mixture layer 21 remains unchanged means that resistance remains low between the auxiliary electrode 15 and the second electrode 19 because they are connected through the mixture layer 21. The result is that the display device works without increase in initial driving voltage and continuous driving voltage.

It follows from the foregoing that the present invention contributes to the production of display devices in high yields and the production of long-lived high-luminance display devices with less power consumption.

Figure 5A:
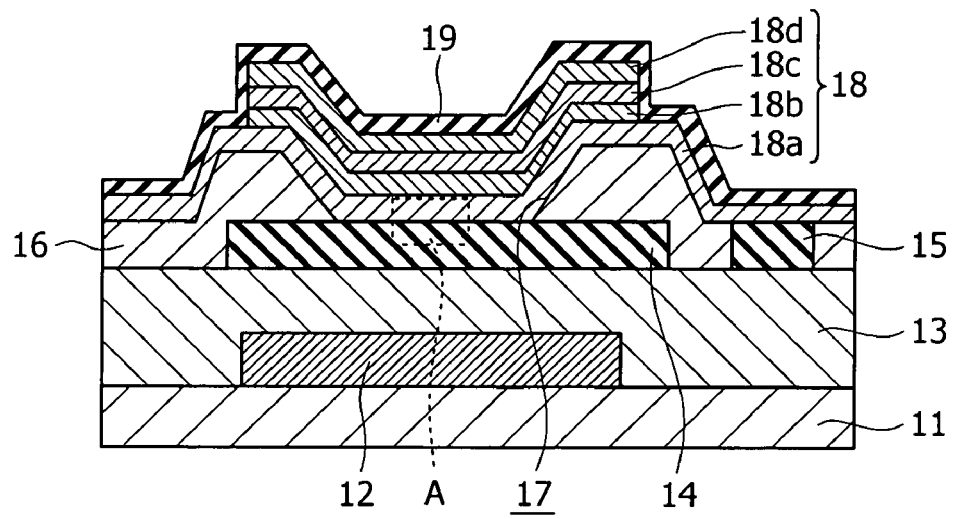
FIG. 5A is a sectional view showing a step of the method in related art for manufacturing a display device.
Figure 5B:
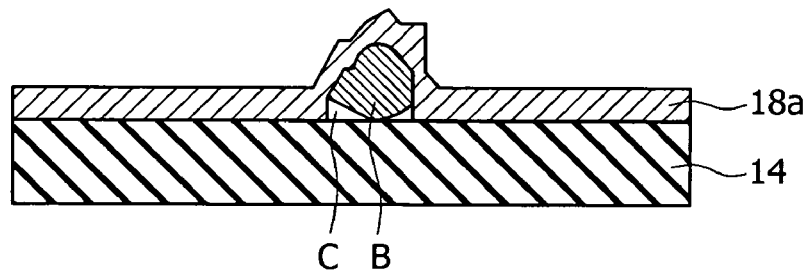
FIG. 5B is a sectional view showing a step of the method in related art for manufacturing a display device.
Figure 5C:
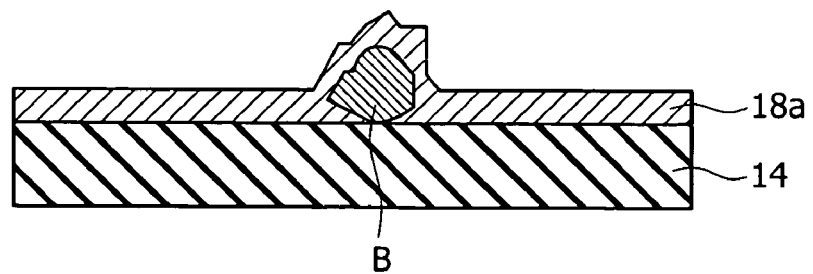
FIG. 5C is a sectional view showing a step of the method in related art for manufacturing a display device.

The first embodiment is concerned with a display device having organic light-emitting elements for three colors (RGB). However, the present invention may also be applied to a display device having organic light-emitting elements for white light. In the case of display device having organic light-emitting elements for white color, it is not necessary to form the organic layer 18 for individual colors in the organic light-emitting element. Therefore, the organic layer 18 is formed by deposition over the entire surface. In other words, the organic layer 18 (excluding the hole injection layer 18a) is formed on the hole injection layer 18a if the hole injection layer 18a is formed on the isolation dielectric film 16 such that it covers the first electrode 14 and the auxiliary electrode 15 and then heat treatment is performed, as mentioned above with reference to FIG. 5 in the section of prior art. The disadvantage of this structure is that heat treatment deteriorates the hole injection layer 18a and other organic layers 18 which exist between the auxiliary electrode 15 and the second electrode 19, thereby increasing resistance between these two electrodes. However, according to this embodiment, the mixture layer 21 as a substitute for the hole injection layer 18a is exempt from deterioration by heating. Thus, resistance between the auxiliary electrode 15 and the second electrode 19 does not increase even though there exist the mixture layer 21 and other organic layers 18 between these two electrodes.

The first embodiment mentioned above is based on the assumption that the mixture layer 21 is formed from an organic material which is a hole injection material or a hole transporting material. This organic material may also be an electron injection material or an electron transporting material. In this case, the first electrode 14 and the second electrode 19 function as the cathode and anode, respectively, and the production method involves the following steps. The mixture layer 21 comprising two or more organic materials differing in Tg is formed on the isolation dielectric film 16 covering the first electrode 14 and the auxiliary electrode 15. Then the mixture layer undergoes heat treatment at a temperature higher than the Tg of the organic material having the lowest Tg and lower than the Tg of the organic material having the highest Tg. On the mixture layer 21 is sequentially formed the electron transporting layer, the light-emitting layer, and the hole transporting layer. In this way the organic layer 18 including the mixture layer 21 is formed. Finally, the second electrode 19 is formed such that it covers the organic layer 18 and the mixture layer 19 outside the pixel opening 17.

The Second Embodiment

Figure 2:
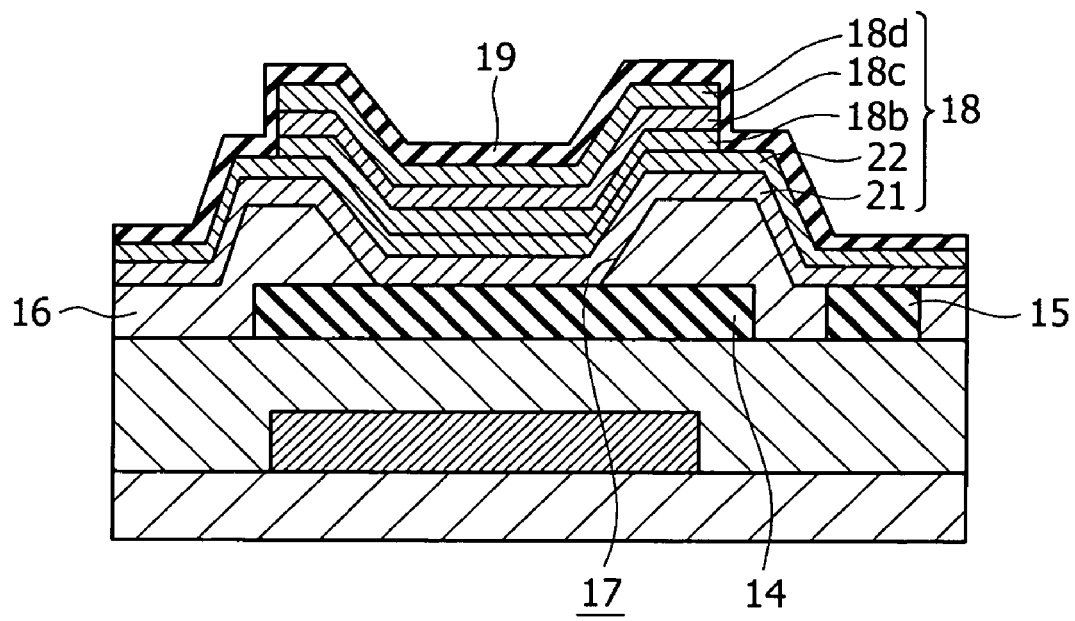
FIG. 2 is a sectional view showing the second embodiment of the method for manufacturing a display device according to an embodiment of the present invention.

The second embodiment of the present invention, which is concerned with the display device and the method for manufacturing thereof, will be described below with reference to FIG. 2. The steps up to the mixture layer 21 are the same in both the first and second embodiments, and hence their description is omitted.

As mentioned in the first embodiment, the isolation dielectric film 16 covering the first electrode 14 and the auxiliary electrode 15 is coated with the mixture layer 21 comprising a low-Tg organic material having $Tg_1$ and a high-Tg organic material having $Tg_2$. On the mixture layer 21 is formed the hole transporting layer 22 (the first charge transporting layer) of organic material. The organic material for the hole transporting layer 22 should be selected from those having a Tg which is higher than the temperature at which heat treatment is performed on the mixture layer 21 and the hole transporting layer 22. The temperature of this heat treatment is higher than $Tg_1$ and lower than $Tg_2$. The selected organic material should withstand this heat treatment. In this embodiment, the hole transporting layer 22 is formed from Cu-Pc which is a high-Tg organic material with $Tg_2$ constituting the mixture layer 21.

Heat treatment is performed on the mixture layer 21 and the hole transporting layer 22 at a temperature higher than $Tg_1$ and lower than $Tg_2$. Heat treatment in this manner permits the low-Tg organic material to flow, so that the mixture layer 21 covers foreign matter adhering to the first electrode 14, thereby removing air under the foreign matter. Heating at a temperature lower than $Tg_2$ permits the high-Tg organic material in the mixture layer 21 and the hole transporting layer 22 to remain intact without thermal degradation.

The hole transporting layer 18b (the second charge transporting layer), the light-emitting layer 18c, and the electron transporting layer 18d are sequentially formed by vapor deposition in such a way that they cover the inner wall of the pixel opening 17 in which the hole transporting layer 22 has been formed. This step is carried out for the organic light-emitting element of each color, by using a deposition mask (not shown) placed on the substrate 11. Thus the organic layer 18 including the mixture layer 21 and the hole transporting layer 22 is formed for each color. In this case, the hole transporting layer 18b is formed from the same material (or Cu-Pc) as used for the above-mentioned hole transporting layer 22. The fact that the hole transporting layer 18b with heat treatment and the hole transporting layer 22 without heat treatment are formed from the same material produces the effect of improving the hole injection efficiency because the barrier that is encountered when holes are injected from the hole transporting layer 18b into the hole transporting layer 20 is lower than that encountered in the case where they are formed from different materials.

Subsequently, an electron injection layer (not shown) of LiF is formed on the organic layer 18 and on the hole transporting layer 22 outside the pixel opening 17. Then, on the electron injection layer is formed the second electrode (cathode) 19, about 10 nm thick, from semitransparent MgAg alloy, so that the second electrode 19 is connected to the auxiliary electrode 15 through the electron injection layer, the mixture layer 21, and the hole transporting layer 22.

The subsequent steps are the same as those in the first embodiment. Thus there is obtained the organic light-emitting display device of top emission type.

The above-mentioned display device and the above-mentioned method for production of the display device offer the following advantage. The mixture layer 21 comprising two organic materials differing in Tg is heated at a temperature higher than $Tg_1$ and lower than $Tg_2$, so that it prevents the occurrence of dark spots resulting from air entrapped by foreign matter which might adhere to the first electrode 14 and it also prevents the unbalanced hole injection, as in the first embodiment.

According to the second embodiment, which is concerned with the display device and the method for manufacturing thereof, the hole transporting layer 22 of an organic material is formed on the mixture layer 21, the mixture layer 21 and the hole transporting layer 22 undergo heat treatment, and the hole transporting layer 18b is formed on the hole transporting layer 22 from the same organic material as used for the hole transporting layer 22. The fact that the hole transporting layer 22 with heat treatment and the hole transporting layer 18 without heat treatment are formed from the same material produces the effect of improving the hole injection efficiency because the barrier that is encountered when holes are injected from the hole transporting layer 22 into the hole transporting layer 18 is lower than that encountered in the case where they are formed from different materials.

The second embodiment is concerned with a display device having organic light-emitting elements for three colors (RGB). However, the present invention may also be applied to a display device having organic light-emitting elements for white light. In this case, the organic layer 18 is formed by deposition over the entire surface, so that the mixture layer 21, the hole transporting layer 22, and the organic layer 18 exist between the auxiliary electrode 15 and the second electrode 21. This structure produces the same effect as in the first embodiment.

As mentioned in the first embodiment, the mixture layer 21 may be formed from an electron injection material or an electron transporting material. In this case, the first electrode 14 and the second electrode 19 function as the cathode and anode, respectively, and the electron transporting layer is formed on the mixture layer 21. The organic material for the electron transporting layer should have a Tg higher than a temperature for heat treatment to be performed later. Then the electron transporting layer, together with the mixture layer, undergo heat treatment at a temperature higher than the Tg of the organic material (for the mixture layer 21) having the lowest Tg and lower than the Tg of the organic material having the highest Tg. After that, the organic layer 18 is formed which comprises the electron transporting layer, the light-emitting layer, and the hole transporting layer, which are placed on top of the other. Finally, the second electrode 19 is formed such that it covers the organic layer 18 and the electron transporting layer outside the pixel opening 17.

This embodiment involves heat treatment that is performed after the hole transporting layer 22 has been formed on the isolation dielectric film 16 enclosing the first electrode 14 and the auxiliary electrode 15. However, the same effect as mentioned above is obtained even though the hole transporting layer 22 is formed after heat treatment because it is not affected by heat treatment.

The Third Embodiment

Figure 3:
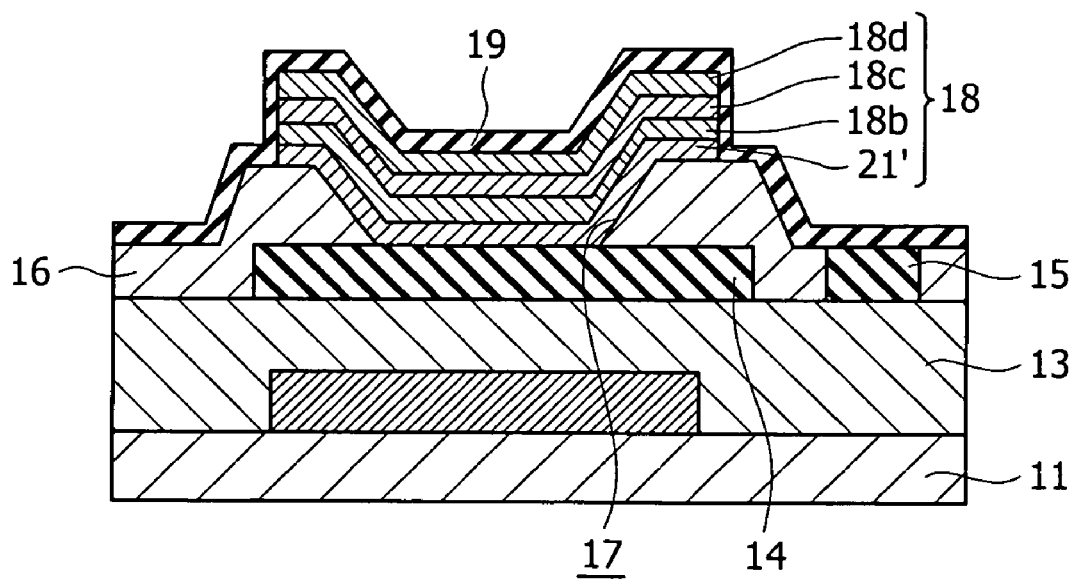
FIG. 3 is a sectional view showing the third embodiment of the method for manufacturing a display device according to an embodiment of the present invention.

The third embodiment of the present invention, which is concerned with the display device and the method for manufacturing thereof, will be described below with reference to FIG. 3. The same steps as in the first embodiment are repeated until the isolation dielectric film 16 is formed on the planarized insulating film 13 such that it covers the first electrode 14 and the auxiliary electrode 15 and the surfaces of the first electrode 14 and the auxiliary electrode 15 are exposed, and hence their description is omitted.

In the case where organic light-emitting elements for three colors (RGB) are to be formed, codeposition is carried out by using deposition masks for individual colors. That is, the mixture layer 21' of a low-Tg organic material (with $Tg_1$) and a high-Tg organic material (with $Tg_2$) is formed three times in the pixel opening 17 in which the first electrode 14 is exposed. With the deposition mask removed, heat treatment is performed at a temperature higher than $Tg_1$ and lower than $Tg_2$ of the mixture layer 21'.

As in the first embodiment, the mixture layer 21' is coated with the hole transporting layer 18b, the light-emitting layer 18c, and the electron transporting layer 18d by vapor deposition which is repeated continuously three times by using deposition masks for different colors. In this way the organic layer 18 for each color is formed which comprises the above-mentioned layers and the mixture layer 21'.

Subsequently, an electron injection layer (not shown) of LiF is formed on the organic layer 18 and the isolation dielectric layer 16. Further, on the electron injection layer is formed the second electrode (cathode) 19, about 10 nm thick, from semitransparent MgAg alloy, so that the second electrode 19 is connected to the auxiliary electrode 15 through the electron injection layer.

The subsequent steps are the same as those in the first embodiment. Thus there is obtained the organic light-emitting display device of top emission type.

The above-mentioned display device and the above-mentioned method for production of the display device also offer the advantage of preventing dark spots arising from air entrapped by foreign matter adhering to the first electrode 14 and maintaining balanced hole injection. Another advantage is that resistance between the auxiliary electrode 15 and the second electrode 19 does not increase because there exists only the electron injection layer between the auxiliary electrode 15 and the second electrode 19. Thus the resulting display device works without increase in initial driving voltage and continuous driving voltage.

The first to third embodiments mentioned above are concerned with the organic light-emitting display device of top emission type. However, the present invention may also be applied to that of bottom emission type. In this case, the lower substrate 11 is made of a transparent material such as glass and plastics and the first electrode 14 is also formed from a transparent material such as ITO. In addition, the second electrode 19 is formed from a highly reflective opaque material such as Ag, so that the light generated by the light-emitting layer 18c is reflected by the second electrode 19 and the light radiates from the first electrode 14. Moreover, the present invention may also be applied to that of top-bottom emission type. In this case, the substrate 11 and its opposite substrate are made of transparent material and the first electrode 14 and the second electrode 19 are also made of transparent material, so that the light generated by the light-emitting layer 18 radiates from both sides.

The above-mentioned embodiments are concerned with organic light-emitting display devices of active matrix drive with TFTs 12. The present invention may also be applied to organic light-emitting display devices of passive drive type by duty drive.

EXAMPLES

The invention will be described in more detail with reference to the following examples.

An organic light-emitting display device of top emission type, as shown in FIG. 1B, was produced in the same way as mentioned in the first embodiment. In Comparative Example 1, an organic light-emitting display device was produced in such a way that the mixture layer 21 did not undergo heat treatment. In Comparative Example 2, an organic light-emitting display device was produced in such a way that the hole injection layer 18a (a single layer of α-NPD) was formed on the isolation dielectric film 16 enclosing the first electrode 14 and the auxiliary electrode 15 (as explained with reference to FIG. 5A in the section of prior art) and then the hole injection layer 18a underwent heat treatment at a temperature higher than the Tg of α-NPD. In Comparative Example 3, an organic light-emitting display device was produced in the same way as in Comparative Example 2 except that the hole injection layer 18a did not undergo heat treatment. All of the organic light-emitting display devices thus produced were examined for the number (per $cm^2$) of dark spots (larger than 1 μm) that occurred when they were driven by DC with a current density of 10 $mA/cm^2$. They were also examined for the initial driving voltage and the change of voltage with time during their operation by DC with a current density of 10 $mA/cm^2$.

The results of examination are as follows. In Comparative Example 1, the number of dark spots was 82/$cm^2$. By contrast, in Example, the number of dark spots was 6/$cm^2$. It is apparent that the number of dark spots is greatly reduced by heating the mixture layer 21. On the other hand, in Comparative Example 2, the number of dark spots was 5/$cm^2$. This is because the hole injection layer 18a underwent heat treatment even though it is a single layer of α-NPD. It was confirmed that the effect of reducing dark spots is the same in both the organic light-emitting display device according to Example in which the mixture layer 21 underwent heat treatment and the organic light-emitting display device according to Comparative Example 2 in which the single layer of α-NPD underwent heat treatment.

FIG. 4 is a graph showing the relation between the driving time (abscissa) and the driving voltage (ordinate) which was observed in the organic light-emitting display devices mentioned above. It is noted from this graph that the display device with an α-NPD single layer which underwent heat treatment has a high initial driving voltage and increases in continuous driving voltage with time. By contrast, it is also noted that, as compared with the display device with an α-NPD single layer, the one with the mixture layer 21 has a lower initial driving voltage (about 1 V) and increases less in driving voltage with time after continuous operation with 10 $mA/cm^2$.

It should be understood by those skilled in the art that various modifications, combinations, sub-combinations and alterations may occur depending on design requirements and other factors insofar as they are within the scope of the appended claims or the equivalents thereof.

What is claimed is:

1. A method for manufacturing a display device comprising a first electrode, an organic layer including a light-emitting layer, and a second electrode which are sequentially arranged on a substrate, said method comprising the steps of providing a first electrode on a substrate, providing on said first electrode a mixture layer comprising two or more organic materials differing in glass transition point, heating said mixture layer at a temperature higher and lower than respectively the lowest and highest of the glass transition points of said organic materials, providing a light-emitting layer on said mixture layer, thereby providing an organic layer having at least said mixture layer and said light-emitting layer, and finally providing a second electrode on said organic layer.

2. The method for manufacturing a display device as defined in claim 1, wherein the organic material is a hole transporting material or a hole injection material.

3. The method for manufacturing a display device as defined in claim 1, wherein the organic material having the lowest glass transition point is an amine-based one and the organic material having the highest glass transition point is a non-amine-based one.

4. The method for manufacturing a display device as defined in claim 1, wherein the difference between the highest glass transition point and the lowest glass transition point of the organic materials is not smaller than 50° C.

5. The method for manufacturing a display device as defined in claim 1, wherein the lowest glass transition point of the organic material is no higher than 150° C. and the highest glass transition point of the organic material is no lower than 200° C.

6. The method for manufacturing a display device as defined in claim 1, wherein the mixture layer has a thickness between 1 nm and 100 nm.

7. The method for manufacturing a display device as defined in claim 1, wherein in the step of providing the first electrode, the auxiliary electrode for the second electrode is formed on the substrate in such a way that it is isolated from the first electrode, in the step of providing the mixture layer, the mixture layer is formed over the first electrode and the auxiliary electrode, in the step of providing the organic layer, the organic layer is formed on at least a portion of the mixture layer covering the first electrode, and in the step of providing the second electrode, the second electrode is formed over at least a portion of the auxiliary electrode.

8. The method for manufacturing a display device as defined in claim 1, which further comprises a step of providing a first charge transporting layer of organic material on the mixture layer after the step of providing the mixture layer and before the mixture layer undergoes heat treatment, and wherein in the step of performing heat treatment on the mixture layer, the first charge transporting layer undergoes heat treatment at the same time, and in the step of providing the organic layer, a second charge transporting layer is formed on the first charge transporting layer from the same organic material as used for the first charge transporting layer and subsequently the light-emitting layer is formed on the second charge transporting layer.

* * * * *